United States Patent [19]

Henry

[11] Patent Number: 4,498,151
[45] Date of Patent: Feb. 5, 1985

[54] ON BOARD NON-VOLATILE MEMORY PROGRAMMING

[75] Inventor: Raymond W. Henry, Dallas, Tex.

[73] Assignee: Texas Instruments Incorporated, Dallas, Tex.

[21] Appl. No.: 556,472

[22] Filed: Jan. 17, 1984

Related U.S. Application Data

[63] Continuation of Ser. No. 141,090, Apr. 17, 1980.

[51] Int. Cl.³ .............................................. G06F 7/00
[52] U.S. Cl. .................................................... 364/900
[58] Field of Search ................................ 364/200, 900

[56] References Cited

U.S. PATENT DOCUMENTS 4,402,057 8/1983 Itou et al. ............................ 364/900

OTHER PUBLICATIONS

The "El Cheapo PROM Programmer", by Dr. Ward McFarland, published in Kilohaud-Microcomputing, Mar. 1979, pp. 46-50.

Primary Examiner—Gareth D. Shaw
Assistant Examiner—John G. Mills
Attorney, Agent, or Firm—John A. Haug; James P. McAndrews; Melvin Sharp

[57] ABSTRACT

A digital system is disclosed for programming a non-volatile memory, such as a programmable read only memory (PROM), while it is in situ in the operating system of which it forms a part. The digital system includes a read/write (R/W) memory and a non-volatile memory which communicate with one another through a two-way data communication bus. Data, address, and circuit select signals are provided to the R/W memory to enter information therein. Upon completion of entry of the data (e.g., a control program) into R/W memory, timing circuitry provides selective signals, such as circuit select, program pulse and program voltage signals to the non-volatile PROM memory and the data or control program is transferred to the PROM memory without removing the PROM from the system. Additional circuitry allows this data or control program stored in the PROM memory to be transferred back to R/W memory, modified and then transferred back to PROM memory. Verify circuitry is included to compare the R/W memory data with the PROM memory data for differences to indicate programming errors and also to check the PROM to ensure, prior to programming, that it is completely erased and ready for programming.

8 Claims, 12 Drawing Figures

ON BOARD NON-VOLATILE MEMORY PROGRAMMING

This application is a continuation of application Ser. No. 141,090, filed Apr. 17, 1980.

This invention relates to memories and more particularly to a system for implementing data transfer between a read/write memory and a non-volatile memory.

Semiconductor memory devices which are non-volatile have great utility in that the information stored in them is not lost when the power supply to it is removed. Such devices, by way of example, are PROMS or bubble memories. Although all PROMS are programmable, some are not electrically alterable or deprogrammable. One such group of PROMS that are deprogrammable are the ultraviolet PROMS which, when exposed to ultraviolet light, erases the stored data.

However, one disadvantage of non-volatile memories, such as PROMS, is that a PROM must be removed from the system in which it is operating and inserted into a separate "PROM Programmer" in order to transfer data from a R/W memory in the system to the "on board" PROM. "On-board" for purposes of this invention is defined as being on the same board or on different boards but in the same operating equipment. This can be seen more clearly by reference to U.S. Pat. No. 4,030,080 entitled "Variable Module Memory" to Burkett et al and assigned to the assignee of the present invention. Related patents are U.S. Pat. Nos. 3,938,104; 3,924,242; 3,953;834; 4,092,730 and 3,982,230. The '080 patent discloses a programmable logic controller which is used for controlling processing machines and manufacturing lines and the like. Such controllers in general have a large number of output storage devices associated therewith, which devices are employed to connect power sources to machine elements or disconnect them at times predicated upon conditions in the system and the relation of such conditions to a programmed set of instructions (control program) stored in a memory in the controller; this set of instructions may be stored in a permanent or removable non-volatile memory (PROM) to control a particular process or machine in the same manner continuously (or until a new PROM is supplied) or the program may be stored in a R/W memory which program may be changed at will.

Multiple relay installations have heretofore been employed to provide control of machines or devices powered from alternating current sources. In the use of systems under direction of programmable logic controllers, it frequently becomes necessary to make changes in the system, for example, because of the addition of more operative elements which must be controlled by the controller. When in the system described in U.S. Pat. No. 4,030,080 a change is to be made in the set of instructions stored in the read/write memory (because of the change in the number of the operative elements), this change may be made by use of plug-in input unit 600 communicating with sequencer 10 through cable 600a to change the instructions stored in read/write memory 25-28 illustrated in FIG. 5. As shown in FIG. 5, there is no provision or way to transfer and program the data into the "on-board" PROMS 30-33 without physically removing a PROM from the programmable controller circuitry and utilizing a separate black box "PROM Programmer" especially designed to program PROMS. Typical of such prior art PROM Programmers is the System 19 model manufactured and sold by Data I/O Corporation, P.O. Box 308, Issaquah, Wash. 98027 and the Series 90 model manufactured and sold by Pro-Log Corporation, 2411 Gordon Road, Monterey, Calif. 93940.

Separate PROM Programmer units have several disadvantages. These units are very expensive (in the range of $1500 to $2500 and require special interface circuitry to connect between the PROMS, the R/W memory and the programmable logic controller. Normally these separate PROM Programmers are purchased in small quantities as compared to the number of PROMS to be processed and accordingly delays will occur in gaining access to a PROM Programmer to modify the PROM memory when required. Also by having a separate unit with cable therebetween, the possibility of remote external noise pickup is enhanced which may alter the program as it is transferred from read/write memory to the PROMS plugged into the PROM Programmer unit. Other disadvantages include the requirement to manually remove the chips from the circuit board in the programmable logic controller and plug it into the PROM Programmer which could cause potential difficulties, such as bent or broken leads, inserting the PROM incorrectly into the PROM Programmmer and other problems associated with manual handling of the devices.

SUMMARY OF THE INVENTION

Briefly the invention relates to a digital system having a read/write memory for storing data therein and a non-volatile memory comprising means for programming the non-volatile memory and means for writing data therein and circuit means for transferring data into and out of each of the memories and generating enabling/disabling signals to the non-volatile memory and the read/write memory during programming of the non-volatile memory without removing the non-volatile memory from the system. The system also includes verifying circuit means to verify proper programming of the non-volatile memory comprising data circuit means coupled to the memories for transmitting the data outputs from each of the memories and comparative means coupled to the data circuit means for comparing the outputs for differences between the data in the memories. The read/write memory storage input to the comparator can be changed to a constant voltage level to compare the non-volatile memory output thereto to determine whether the non-volatile memory has been completely erased.

Accordingly, it is an object of the present invention to provide means for programming a memory device without the use of separate, discrete equipment.

Another object of the present invention is to provide a system for programming non-volatile memories without removing them from the board or system in which they are located.

Another object of the present invention is to provide an "on-board" programming capability for a non-volatile memory at a minimal cost and additional circuitry.

Another object of the present invention is to provide a means for programming a non-volatile memory device which is both simple and convenient.

Another object of the present invention is to provide a means for storing programs in a "permanent" non-volatile memory such that they are immediately available to replace a program in Read/Write memory which has been altered, either deliberately or inadvertently.

Another object of the invention is to provide a means for storing a Read/Write and non-volatile memory a first and second program which allows quick changeover of the system from said first program to said second program which effectively "doubles" the memory capacity.

Another object of the present invention is to provide "on-board" PROM programming capability for programmable logic controllers.

Another object of the present invention is to provide inherent compatibility between the "on-board" programming capability and the read/write memory without necessity of an external interface.

Another object of the present invention is to provide "on-board" programming capability in a system which includes read/write memory and PROM by the addition of circuitry to the write circuitry normally present with read/write memories.

Other objects and features of the invention will become more readily understood from the following detailed description and appended claims when read in conjunction with the accompanying drawings.

BRIEF DESCRIPTION OF DRAWINGS

In the accompanying drawings like reference numerals designate like parts throughout the figures thereof, and in which.

DESCRIPTION OF THE PREFERRED EMBODIMENT

Figure 1:
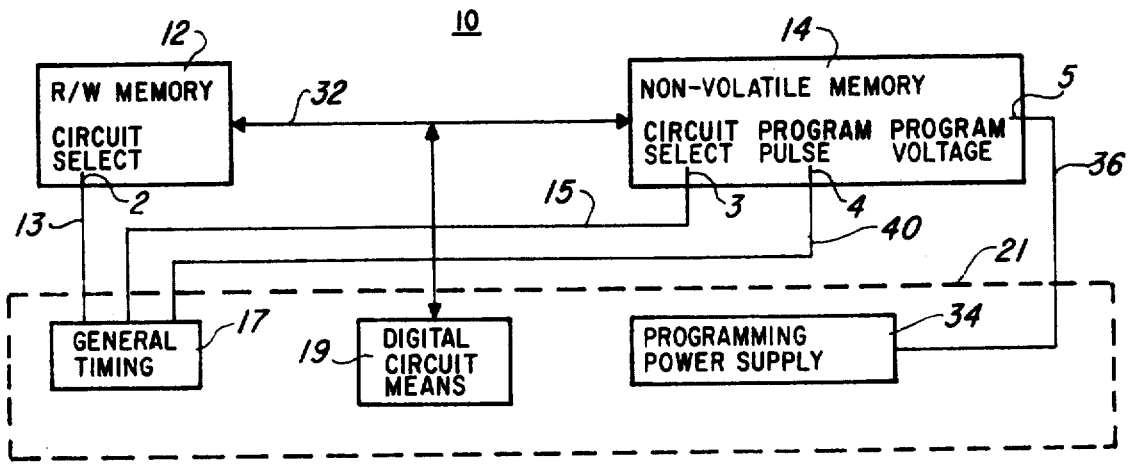
FIG. 1 is a block diagram of the present invention.

Referring now to FIG. 1, there is illustrated a digital system 10 incorporating the present invention. Two memories are illustrated, a Read/Write Memory 12, having a circuit-select terminal 2 and a Non-Volatile Memory 14, which by way of example, could be either a PROM or bubble memory. For purposes of illustration and discussion, Memory 14 is illustrated as a PROM memory; terminals 3-5 of PROM Memory 14 provide a circuit-select, program pulse and program voltage function. Terminals 3-5 have to be activated in order to program PROM Memory 14. Circuit means 21 includes additional circuitry such as General Timing circuit 17 Digital Circuit Means 19 and PROM programming power supply 34 to enable transfer of data via data bus 32 from Read/Write Memory 12 to PROM Memory 14; circuitry 21 and data bus 32 also provide the additional flexibility to allow data to be transferred back from PROM Memory 14 to Read/Write Memory 12. During the phase of developing a program for Read/Write Memory 12, circuit-select terminal 2 is enabled via line 13 from General Timing circuit 17. When the program is fully developed and loaded into Read/Write Memory 12, terminals 3-5 of PROM Memory 14 are enabled in order to transfer the contents of Memory 12 to Memory 14.

This invention may be utilized in any embodiment where a Read/Write Memory is used in combination with a non-volatile memory. For purposes of explanation, this invention will be discussed and illustrated for use in a programmable logic controller such as that illustrated in U.S. Pat. No. 4,030,080 referenced above.

Figure 2:
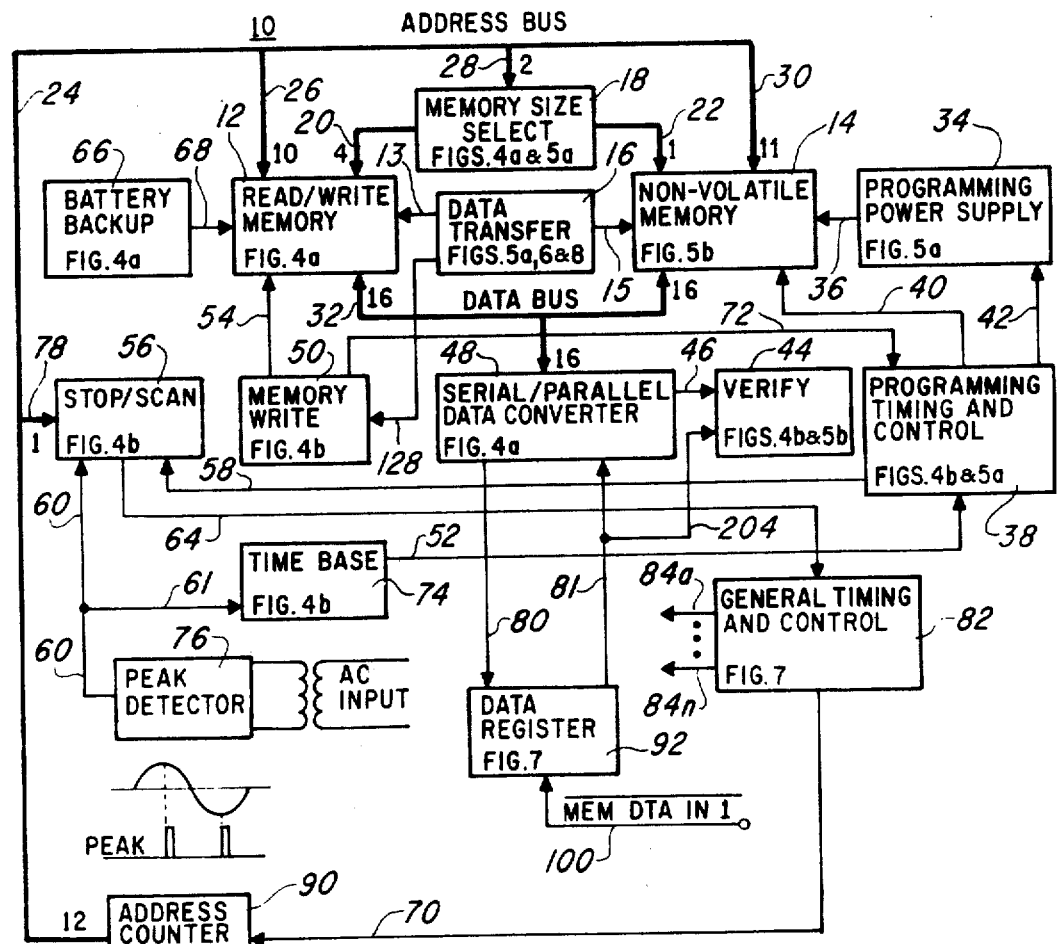
FIG. 2 is a more detailed block diagram of the invention illustrated in FIG. 1.
Figure 3:
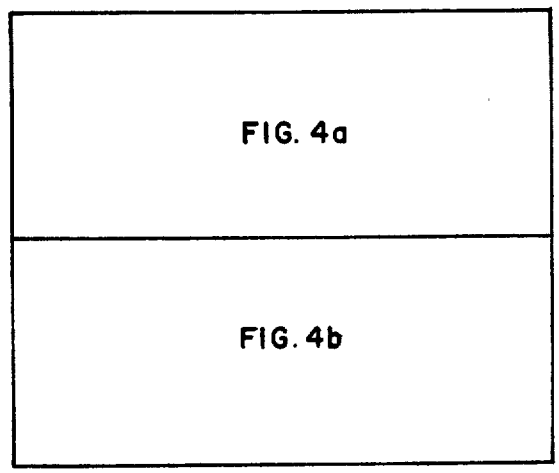
FIG. 3 illustrates the relationships between FIGS. 4A and 4B, 5A and 5B.
Figure 3:
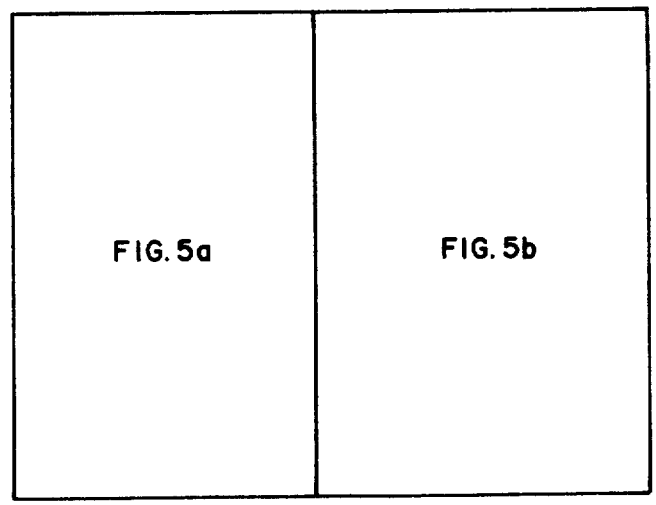

Referring now to FIG. 2, there is illustrated a block diagram of a digital circuit 10 (sequencer) which can be used as a replacement for sequencer 10 illustrated and described in the '080 patent. The Memory 12 includes four discrete banks of memory, each $1K \times 16$ words; in other words, Read/Write Memory 12 has the capability of expanding from $1K \times 16$ words up to $4K \times 16$ words in 1K word increments. In the preferred embodiment of the invention, Read/Write Memory 12 is comprised of CMOS RAM Memory.

The data to be stored in Read/Write Memory 12 is entered on line 100 (signal $\overline{\text{MEM DTA IN 1}}$). The data on line 100 passes through appropriate circuits (to be discussed later) and is entered into Read/Write Memory 12 through Data Bus 32. Address Counter 90 generates twelve outputs which pass along Address Bus 24; branching off is Address Bus 26 which has ten leads inputting Read/Write Memory 12. These ten address signals define a discrete location in each bank of 1K words. Selection of the appropriate bank is accomplished by the Memory Size Select Circuit 18 which branches off two lines 28 from Address Bus 24 and through appropriate circuitry decodes the signals on lines 28 to produce four discrete signals on Bus 20 to specifically select one of the four 1K memory banks to store the discrete word of data information. The Data Transfer Circuit 16 produces memory circuit enable signals to the respective Memories 12 and 14. The memory enable signal generated by Data Transfer Circuit 16 on line 13 enables all of the operable functions within Memory 12. Data Transfer Circuit 16 also generates an enable signal via line 128 to Memory Write Circuit 50 which enable signal is "on" or activated for the entire length of time of word transfer from Memory 12 to Memory 14. If data is to be written into Non-volatile Memory 14, the enable signal on line 128 is conditioned in Memory Write Circuit 50 and is in turn outputted on line 72 to Programming Timing and Control Circuit 38; this signal on line 72 causes a Program Pulse to be generated in Programming Timing and Control Circuit 38 and appear on line 40 to Memory 14.

Memory Write Circuit 50 generates write pulses to enter data into Read/Write Memory 12. Battery Backup Circuit 66 provides a voltage on line 68 to Read/Write Memory 12 which will preserve the information in Memory 12 should power fail or be removed for any reason.

Non-volatile Memory 14, in a preferred embodiment, is an ultraviolet PROM. Address Bus 24 supplies eleven lines via Bus 30 to PROM Memory 14. Data Transfer Circuit 16 also provides a PROM circuit enable signal to PROM Memory 14 via lead 15. In a manner similar to that described with respect to Read/Write Memory 12, the signal on line 15 enables PROM Memory 14 completely for all of its available functions. PROM Memory 14 is comprised of two chips which can be configured in banks of $1K \times 16$, $2K \times 16$, or $4K \times 16$ words. Memory Size Select Circuit 18 produces a signal on single line 22 to Non-volatile Memory 14 which allows different sized PROM memory chips to be installed in the same socket. In normal situations, the size of the PROM memory is equal to the size of the Read/Write Memory 12. Address Bus 30 (comprised of 11 lines) is derived from Address Counter 90 and Address Bus 24 and provides signals to the address terminals of Non-volatile Memory 14 to store data transferred from Read/Write Memory 12 by way of Data Bus 32 to Non-volatile Memory 14. Address Counter 90 and the Memory Size Select Circuit 18 always maintain a one-to-one correspondence between addresses of data in Read/Write Memory 12 and the same data recorded in Non-volatile Memory 14. Programming Power Supply 34 provides a high voltage signal (in the case of ultraviolet PROMS, approximately 25 volts) on line 36 to Non-volatile Memory 14. Timing signals generated by Timing Circuits 38 and 82 are provided on line 40 to produce a Program Pulse of a predetermined duration; again, in the case of ultraviolet PROMS, this pulse is about 50 milliseconds long. This 50 millisecond pulse allows data on Data Bus 32 to be transferred to the addressed location in Non-volatile Memory 14. In order for data to be entered into Non-volatile Memory 14, the proper enabling signals have to be present on lines 15, 36 and 40. The signal on line 42 from the Programming Timing and Control 38 to Programming Power Supply 34 is an "on-off" signal.

Data Register 92 requires the data read from either Read/Write Memory 12 or Non-volatile Memory 14 be transferred to it bit-serially and Data Register 92 supplies data to be written to memory bit-serially (such as the data entered on line 100 into Data Register 92). The organization of both Read/Write Memory 12 and Non-volatile Memory 14 is 16-bit parallel. Therefore, Serial/Parallel Converter 48 is required to perform the function of:

1. Converting 16 bits of parallel data read from Memories 12 and 14 into serial data for Data Register 92, and
2. Converting 16 bits of serial data from Data Register 92 into parallel data for Memories 12 and 14.

Verify Circuit 44 is coupled to Serial/Parallel Data Converter 48 by way of line 46 and the serial output from Data Register 92 is inputted to Verify Circuit 44 by line 81 and 204. Verify Circuit 44 checks to see that the data stored in Memory 12 has been accurately transferred (bit-for-bit) into Non-volatile Memory 14 and also provides the additional function of ensuring that the Non-volatile Memory 14 has been completely erased when required. Verify Circuit 44, when activated, 1. Reads data from Non-volatile Memory 14 and transfers it serially to Data Register 92,
2. Reads data from Read/Write Memory 12 and stores it in Serial/Parallel Converter 48, and
3. Compares in Verify Circuit 44 these two sets of data on a bit-by-bit basis.

As mentioned earlier, Non-volatile Memory 14 requires a Program Pulse (of 50 milliseconds) to appear as an output on line 40 from Programming Timing and Control Circuit 38. Stop/scan Circuit 56, Time Base Circuit 74 and Programming Timing and Control Circuit 38 cooperate to produce the Program Pulse of the required length (50 milliseconds) on line 40. At the same time that Programming Timing and Control Circuit 38 initially applies the Program Pulse to Non-volatile Memory 14 via line 40, this same pulse is applied by way of line 58 to Stop/scan Circuit 56 which immediately disables the main clock by a disable signal applied via line 64 to General Timing and Control Circuit 82. Once the clock is disabled, Time Base Circuit 74 in conjunction with Peak Detector Circuit 76 are the only active circuits in the system. Peak Detector 76 detects the peaks of the AC input line signal. The output from the Peak Detector 76 is a series of pulses coinciding with each AC input peak and is applied via line 60 and 61 to Time Base Circuit 74. Time Base 74 includes a counter which measures 50 milliseconds for the programming pulse (this is 6 counts for 60 hertz and 5 counts for 50 hertz). When the counter in Time Base Circuit 74 counts 50 milliseconds, a release signal is applied to Programming Timing and Control Circuit 38 by way of line 52. This signal, in turn, generates the release signal on line 58 to Stop/scan circuitry 56 which enables the clock circuitry within System 10 via line 64; additionally, the Program Timing and Control Circuit 38 terminates the Program Pulse signal applied to Non-volatile Memory 14 via line 40. With the clock signal applied via line 70 to Address Counter 90, the address counter will cycle to its next position, readying Memories 12 and 14 to transfer information therebetween in the next address position.

Figure 7:
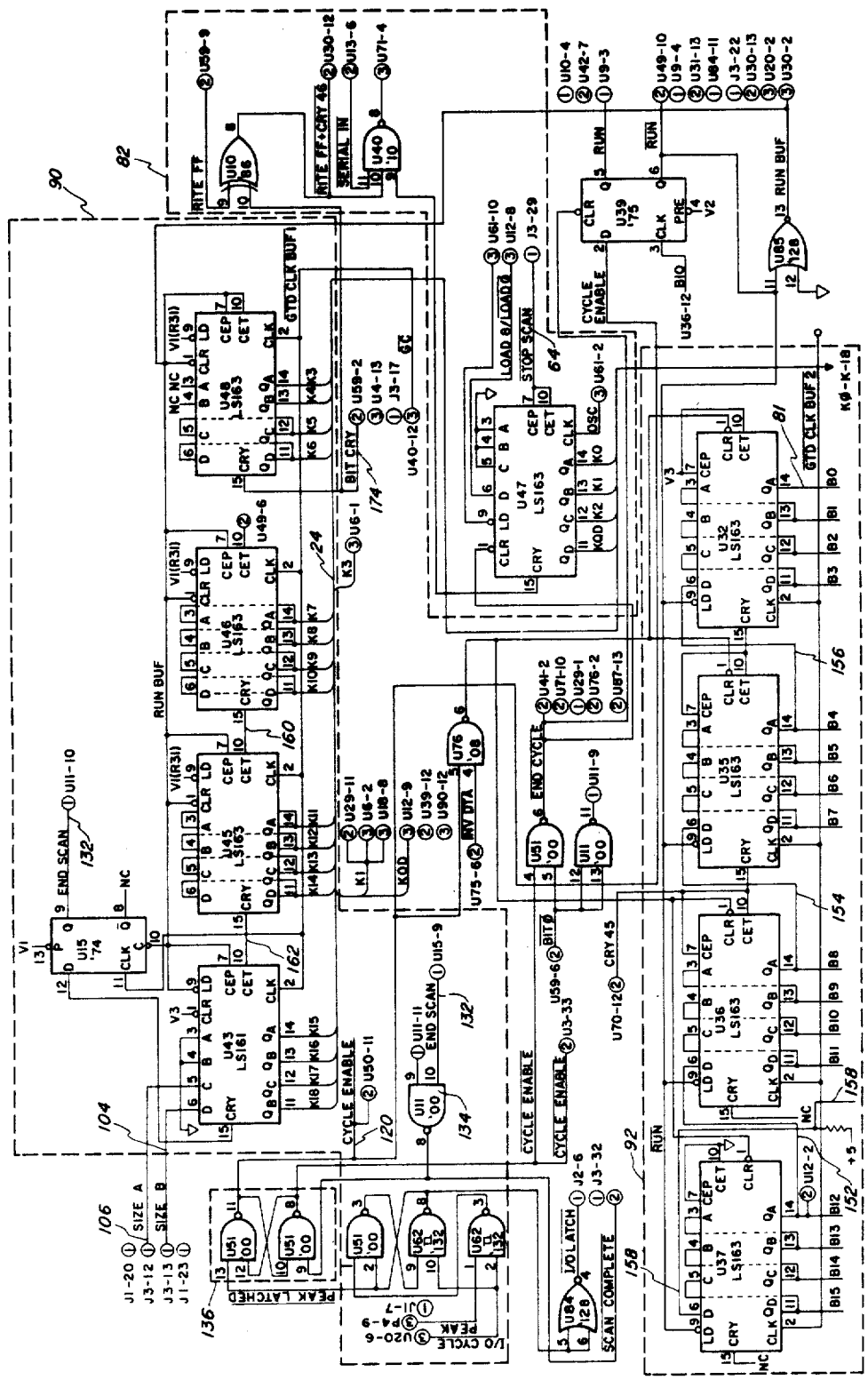
FIG. 7 is a schematic of the Address Counter, the Data Register and the General Timing and Control circuits.

Address Counter 90 is comprised of twelve flip-flops forming a binary counter having twelve outputs that form Data Bus 24. The clocking function required by the internal counter of Address Counter Circuit 90 is provided by General Timing and Control Circuit 82 via line 70. Address counter 90 is illustrated in FIG. 7 and will be described in more detail hereinafter.

Data Register 92 is comprised of 16 bits of binary storage and therefore is capable of storing one wordlength of data in a serial fashion. Data to be stored in Read/Write Memory 12 for possible subsequent storage in Non-volatile Memory 14 is inputted to Data Register 92 by way of line 100. This data will output from Data Register 92 through line 81 to Serial/Parallel Data Converter 48 and then through Data Bus 32 to Read/Write Memory 12. For transfer of data from Read/Write Memory 12 to Non-volatile Memory 14, the data from Memory 12 in turn goes through Data Bus 32, Serial/Parallel Data Converter 48, through line 80 to Data Register 92; the output from Data Register 92 is transmitted through line 81, Serial/Parallel Converter 48 and then through Data Bus 32 to Memory 14. Although this circular transfer of data from Read/Write Memory 12 through Serial/Parallel Converter 48, Data Register 92 to Non-volatile Memory 14 has been illustrated and described, it will be recognized by one skilled in the art that a direct data transfer from Memory 12 to Memory 14 can be implemented; as with the circular transfer, in a direct data transfer a data circuit means would be coupled to said Memories for transmitting the data outputs from each of said Memories. A detailed schematic of Data Register 92 is illustrated in FIG. 7.

General Timing and Control Circuit 82 provides timing signals via lines 84a–84n to the required circuits within the system. As mentioned previously, line 70 from the Timing Circuit 82 to Address Counter 90 provides the clocking function to the counters within Address Counter 90 and line 64 from Stop/scan Circuit 56 to Timing and Control Circuit 82 provides a stop or "freeze" mode on the clock signal for predetermined time periods (50 milliseconds) during which time discrete words are being written into Non-volatile Memory 14.

With the foregoing understanding provided by the description associated with FIG. 2, details of the construction of the system shown in FIGS. 4–10 will now be described.

READ/WRITE MEMORY 12

FIG. 4A

Figure 4A:
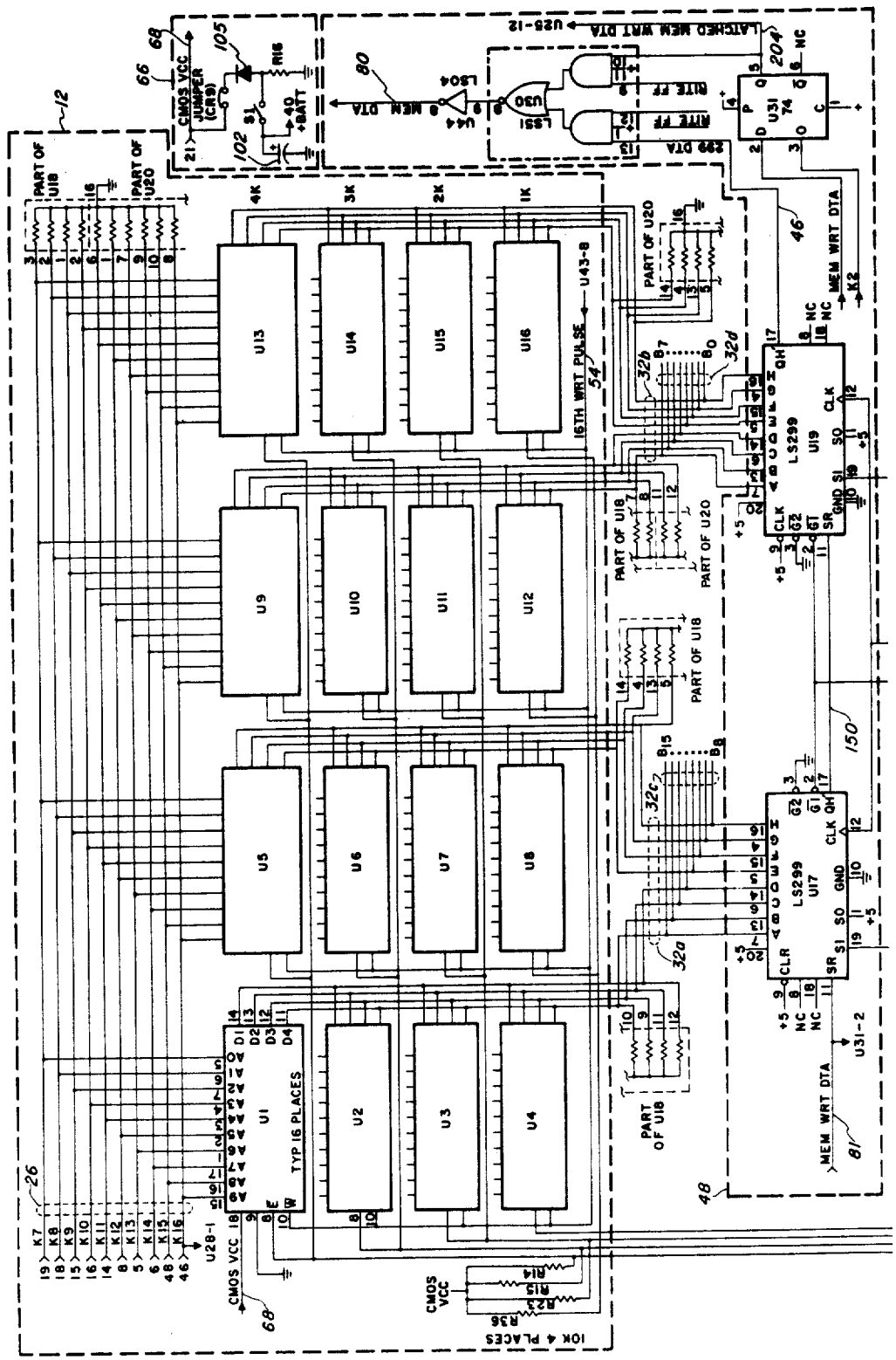
FIGS. 4A is a schematic of the R/W memory and Serial-to-Parallel Data Converter.

Read/Write Memory 12 is illustrated in FIG. 4A. In the preferred embodiment, Memory 12 is comprised of sixteen memory chips, U1–U16, each chip having 1K × 4 word storage. Accordingly, the bank of memory chips U4, U8, U12 and U16 provide 1K × 16 word storage. Chips U1–U4 are all connected in parallel as are U5–U8, U9–U12 and U13–U16. Accordingly, Memory 12, being connected in this manner, is capable of having 1K up to 4K × 16 word storage in the system. Typically, memory chips may be on each of memory chips U1–U16. The two Data Buses, 32a and 32b, correspond to the sixteen line Data Bus 32, illustrated in FIG. 2. Data Buses 32a and 32b are connected by way of Data Buses 32c and 32d, respectfully, to the Non-volatile Memory Chips U49 and U48, respectively (B8–B15 and B0–B7).

NON-VOLATILE MEMORY 14

FIG. 5B

Figure 5A:
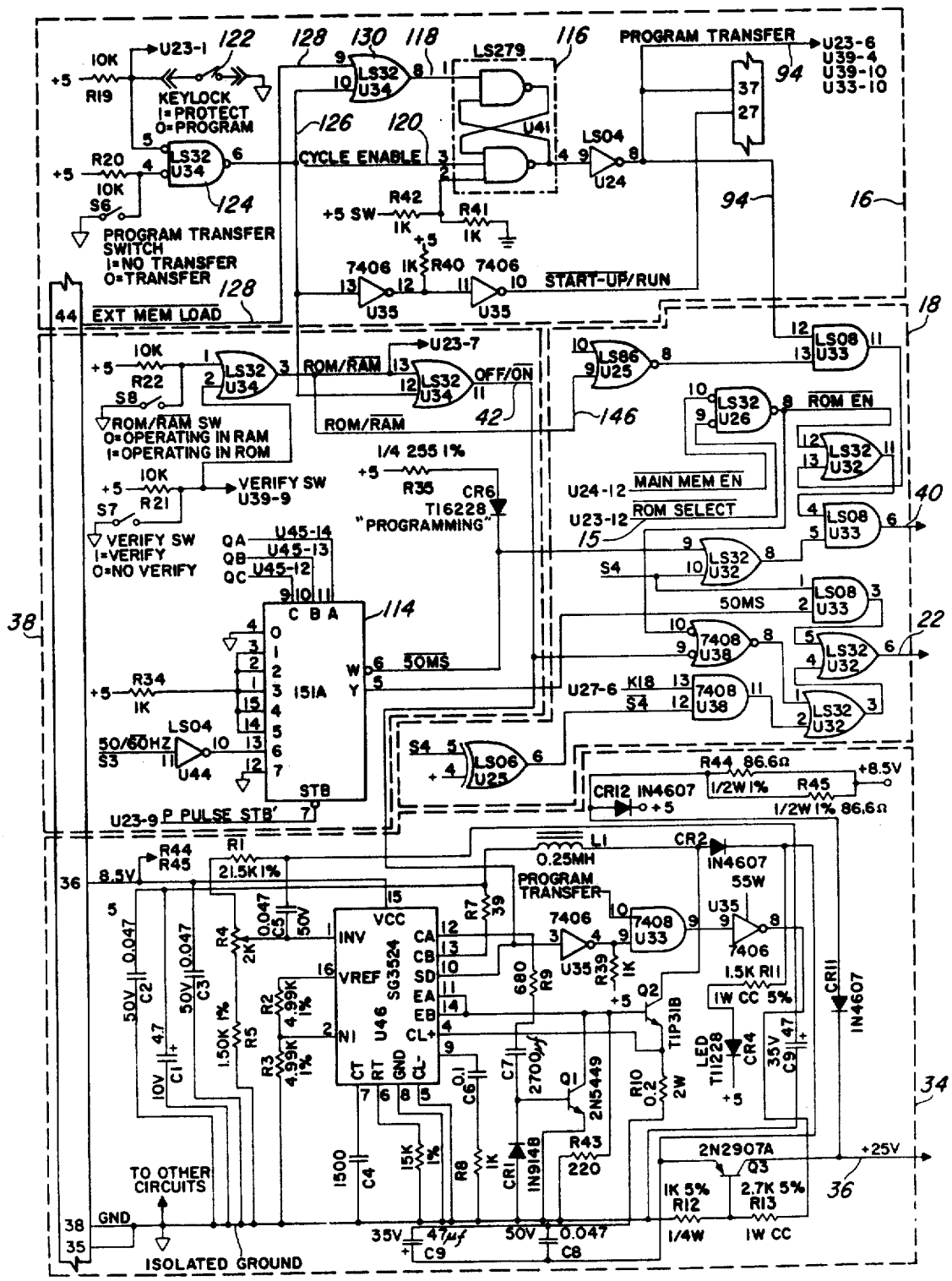
FIG. 5A is a schematic of the Memory Size Select, Data Transfer, Programming Power Supply and Programming Timing and Control Circuits.
Figure 5B:
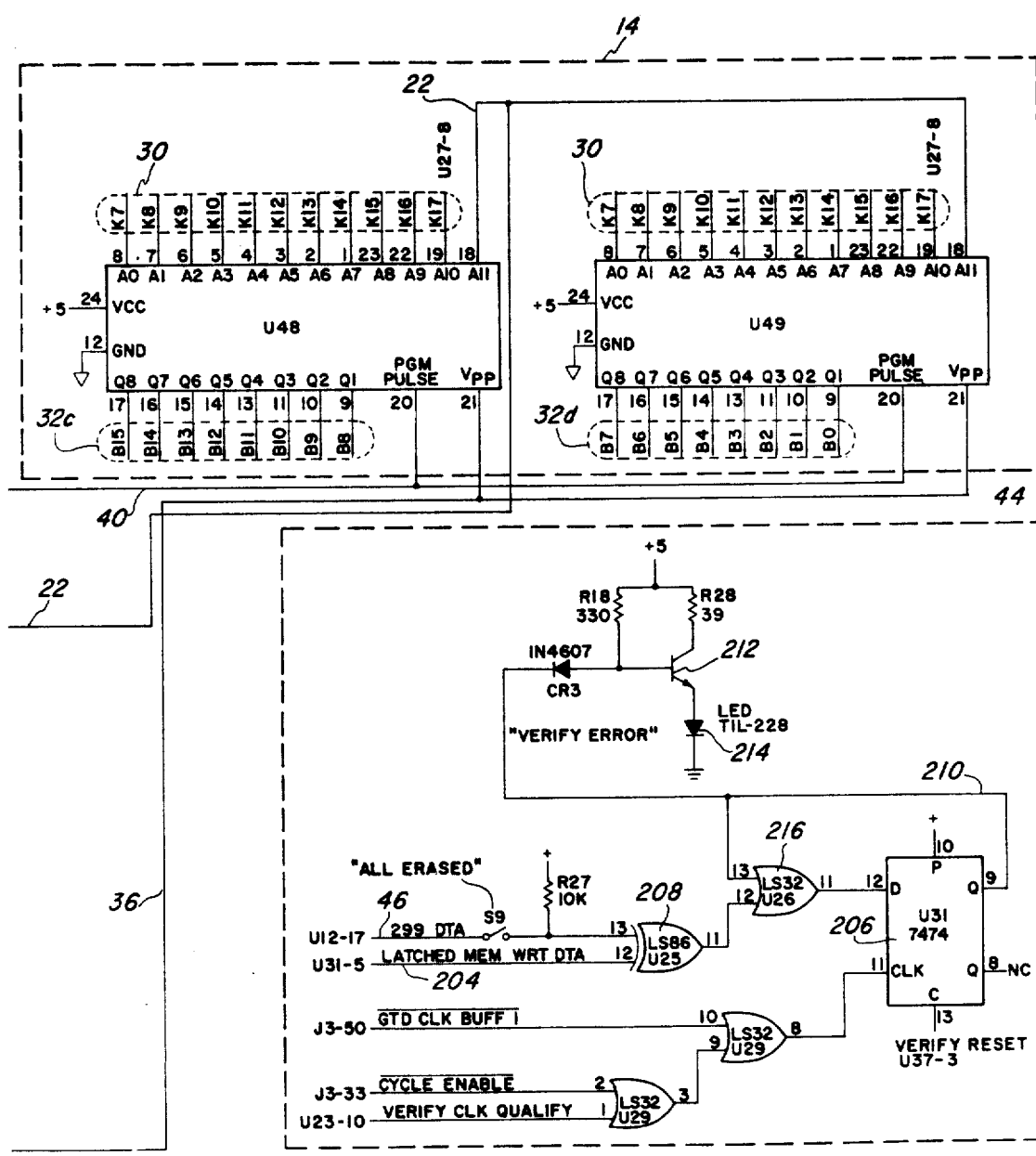
FIG. 5B is a schematic of the Non-volatile Memory and Verify Circuit.

In the preferred embodiment, Non-volatile Memory Chips U49, U48 shown in FIG. 5B are ultraviolet read only memories. However, it will be noted that other types of programmable read only memories as well as other forms of non-volatile memories, such as bubble memories, can be utilized in this invention. Since Memory Chips U48 and U49 are capable of being removed from the system, the user may vary the memory capacity of the chips from 1K × 16 words to 2K × 16 or 4K × 16 words. The determining factor of the choice of size of Memory Chips U48 and U49 is the size of data in Read/Write Memory 12 to be stored in Non-volatile Memory 14. Eleven address lines (K7–K17) form Non-volatile Memory Address Bus 30 from Address Counter 90 (FIG. 7). This Address Bus 30 is connected to terminals 1–8, 19 and 22 and 23 of Memory Chips U48 and U49. As mentioned previously, Data Bus 32c from the output of Read/Write chips U1–U8 are connected to Non-volatile Memory Chip U48 and the data outputs from Memory Chips U9–U16 from Read/Write Memory 12 forms Data Bus 32d, which is connected to the data input terminals of Non-volatile Memory Chip U49. A typical ultraviolet PROM suitable for use, as Memory chip U48 or U49, is the Texas Instruments Model 2508 (1K), Model 2516 (2K) or Model Number 2532 (4K). A Programming Voltage (approximately 25 volts) is produced by Programming Power Supply 34 (see FIG. 5A) and is transmitted via line 36 to pins 21 on Memory Chips U48 and U49. When a 4K memory chip is used as U48 and U49, terminal 20 on each of said chips is a Program Pulse terminal. This pulse for an ultraviolet PROM is typically 50 milliseconds; i.e., this pulse dictates the length of time required to program each word in PROM Memory Chips U48 and U49. This signal is applied by way of line 40 terminal 20) and the Program Voltage (applied to terminal 21) must be present before information can be transferred from Read/Write Memory 12 to PROM Memory 14.

BATTERY BACKUP 66

FIG. 4A

A Battery Backup Circuit is supplied to Read/Write Memory 12 since such memory loses all of its stored data should power be removed. The output 68 from Battery Backup Circuit 66 is connected to terminal 18 of each of Memory Chips U1–U16 in Memory 12. Referring now to Battery Backup Circuit 66, a primary cell 102 is connected to switch S1 which is closed during normal operation. Battery 102 may be, for example, a lithium battery. A diode 105 is connected in series therewith which in turn is connected to a signal CMOS VCC (which is approximately 5 volts). With the normal 5-volt signal present powering each of the memory chips U1–U16, diode 105 is reverse-biased since the primary battery voltage is approximately 3 volts. If, for example, due to power failure CMOS VCC voltage decreases, the diode 105 is forward biased and the primary battery voltage of 3 volts is applied to all of the Memory Chips U1–U16 in Read/Write Memory 12. The 3 volts supplied by battery 102 is sufficient to maintain the stored data within Memory Chips U1–U16, but it is not sufficient to allow normal operation of the system.

MEMORY SIZE SELECT 18

FIGS. 4B, 5A

Memory Size Select 18 performs two different functions. The Memory Size Select circuit in FIG. 4B selects the correct memory size requested by the user and the memory size select circuit illustrated in FIG. 5A selects the proper memory size for Non-volatile Memory 14 and produces predetermined signals to Memory Chips U48 and U49 as required to enable these chips.

Figure 4B:
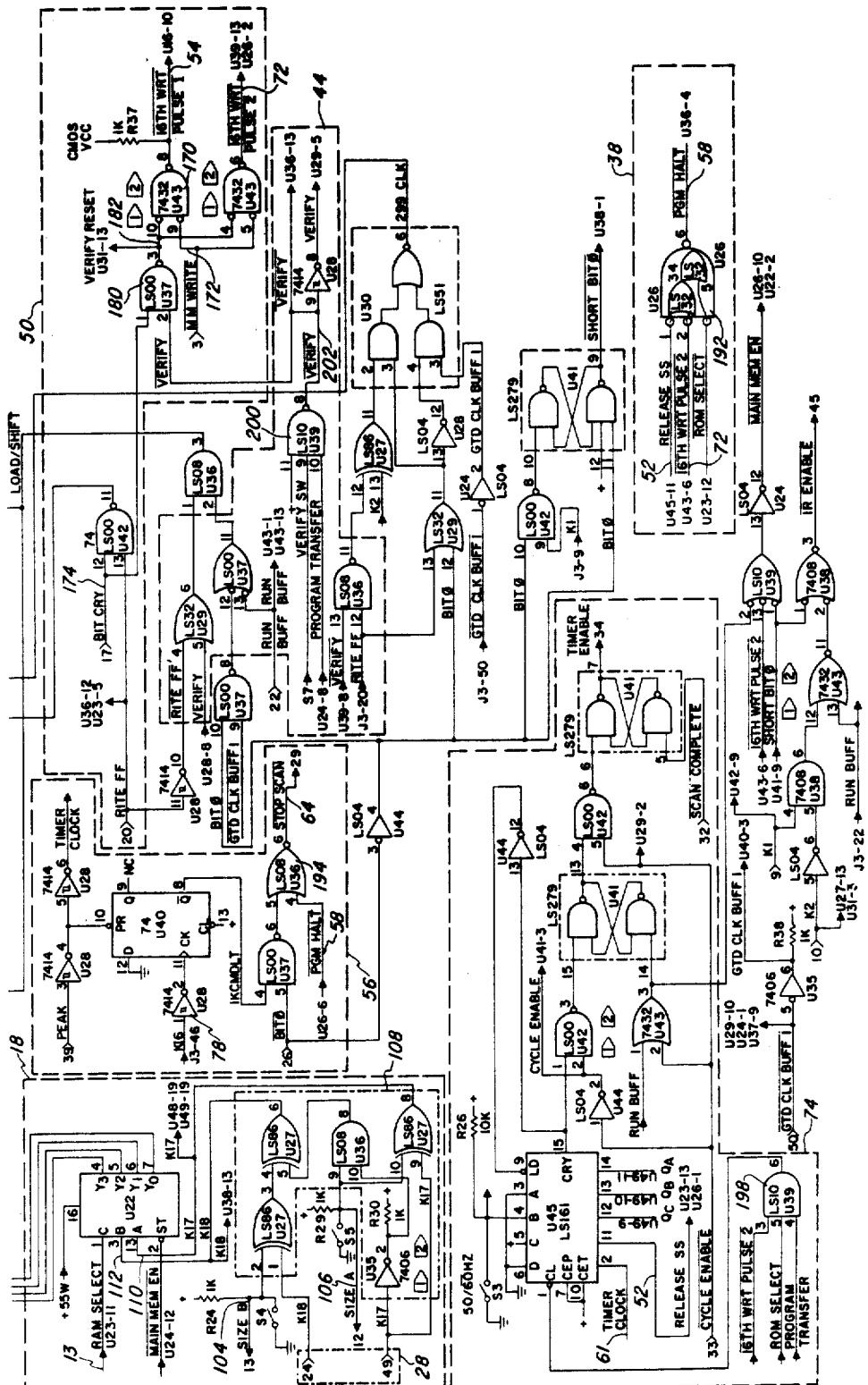
FIG. 4B is a schematic of the Memory Size Select, Stop-Scan, Memory Write, Verify, Time Base, and Program Timing and Control Circuits.

Referring now to FIG. 4B and Select circuit 18, switches S4 and S5 are switched to one of four different switch combinations dependent upon the amount of memory required by the user of the Non-volatile Memory 14 and produces predetermined signals to Memory Chips U48 and U49 as required to enable these chips.

Referring now to FIG. 4B and Select circuit 18, switches S4 and S5 are switched to one of four different switch positions dependent upon the amount of memory required by the user of the system. The condition of switches S4 and S5 are sensed via lines 104 and 106, respectively, which are electrically connected to Address Counter 90 (FIG. 7). The signals applied by lines 104 and 106 to Address Counter 90 and more particularly to counter U43 in Address Counter 90, causes two discreteoutputs K17' and K18' to appear on Address Bus 28. These two signals interact with the signals from switches S4 and S5 in conditioning logic 108 to produce two additional signals K17 and K18 on lines 110 and 112, respectively. A RAM SELECT signal is applied to line 13 and all three signals from lines 13, 110 and 112 are applied to a decoder circuit 22. Decoder U22 is a two-to-four line decoder with an enable circuit included therein. This decoder U22 will produce one and only one active line one lines 4-7 from the output thereof to produce the prescribed amount of memory desired. The signal on line 13, namely RAM SELECT, is always "on" whenever it is desired to either write into or read out of Memory 12. A typical decoder that can be used for U22 is Model SN 74155, manufactured and sold by Texas Instruments Incorporated, Dallas, Tex.

The Memory Select Circuit 18 in FIG. 5A is comprised of a series of operational logic gates to perform various functions. In the Memory Size Select Circuit of FIG. 5A, the switch position of S4 and the state of K18 from line 112 (FIG. 4B) defines the size of Non-volatile Memory 14. Memory elements U48 and U49, dependent upon their memory size, have different pin locations for the Program Pulse and Circuit Enable functions. The logic illustrated in FIG. 5A, circuit 18, provides these functions to the proper terminals. For the 4K PROM memory illustrated in FIG. 5B, the Program Pulse is applied to line 40 and the Circuit Enable (or twelfth address line for the 4K PROM) is applied to line 22.

The PROGRAM TRANSFER Signal is applied via line 94 to Memory Select Circuit 18 and is "on" during the total time the data is being transferred into or out of Memory 14. In addition, the $\overline{\text{ROM SELECT}}$ signal applied to line 15 enables the conditional logic for a time period which is a sub-multiple of the PROGRAM TRANSFER Signal. Still further, a 50 millisecond signal (generated in circuit element 114) is combined with the $\overline{\text{ROM SELECT}}$ signal to produce the Program Pulse (50 milliseconds) signal. This is applied to the proper PROM terminals, as mentioned, by the condition of switch S4 and K18. Circuit 114 is an eight-to-one line encoder; a typical encoder is SN 74151A, manufactured and sold by Texas Instruments Incorporated, Dallas, Tex.

DATA TRANSFER 16

FIGS. 5A, 6, 8

Figure 6:
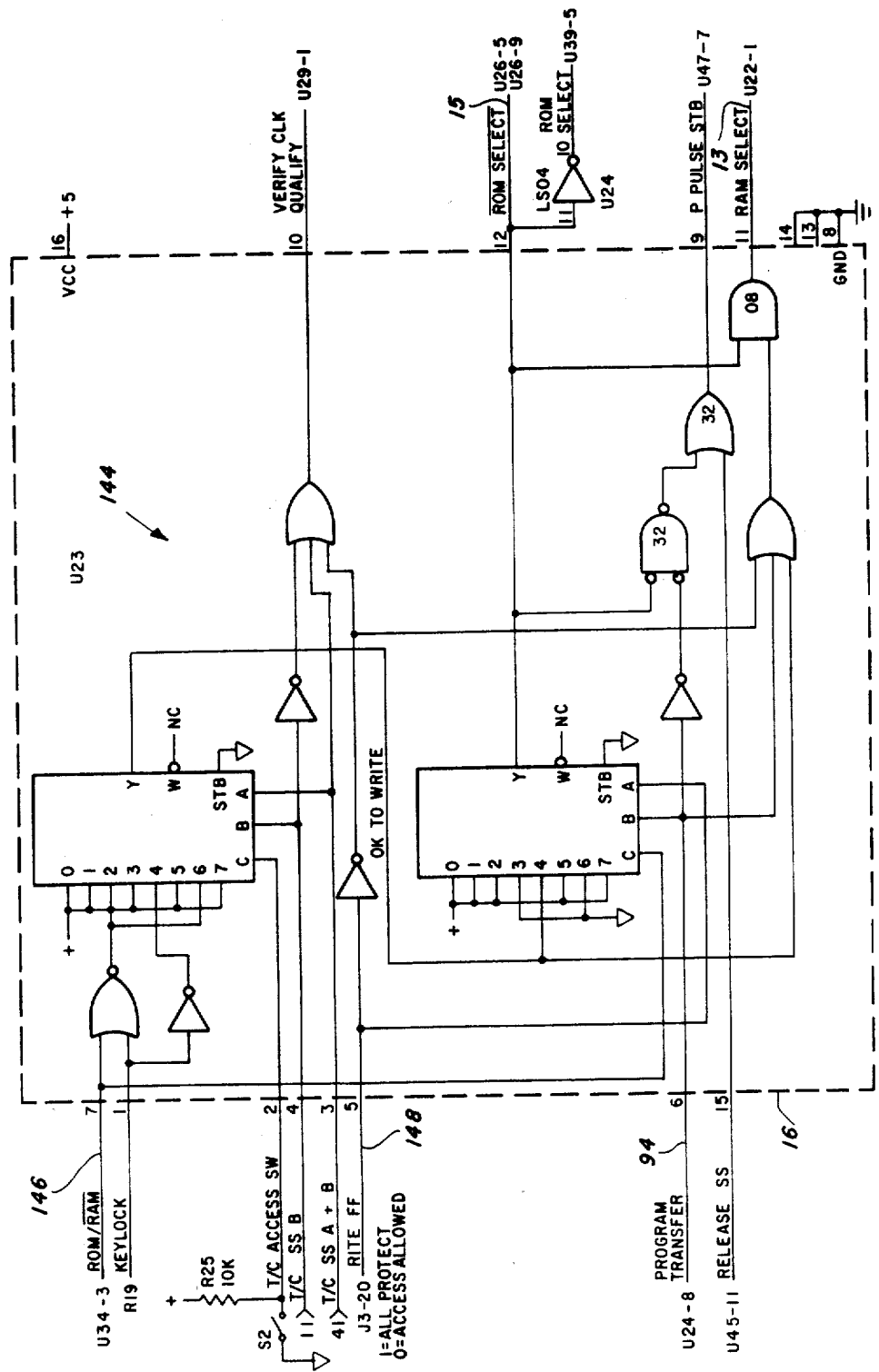
FIG. 6 is a schematic of a part of the Data Transfer Circuit.
Figure 8:
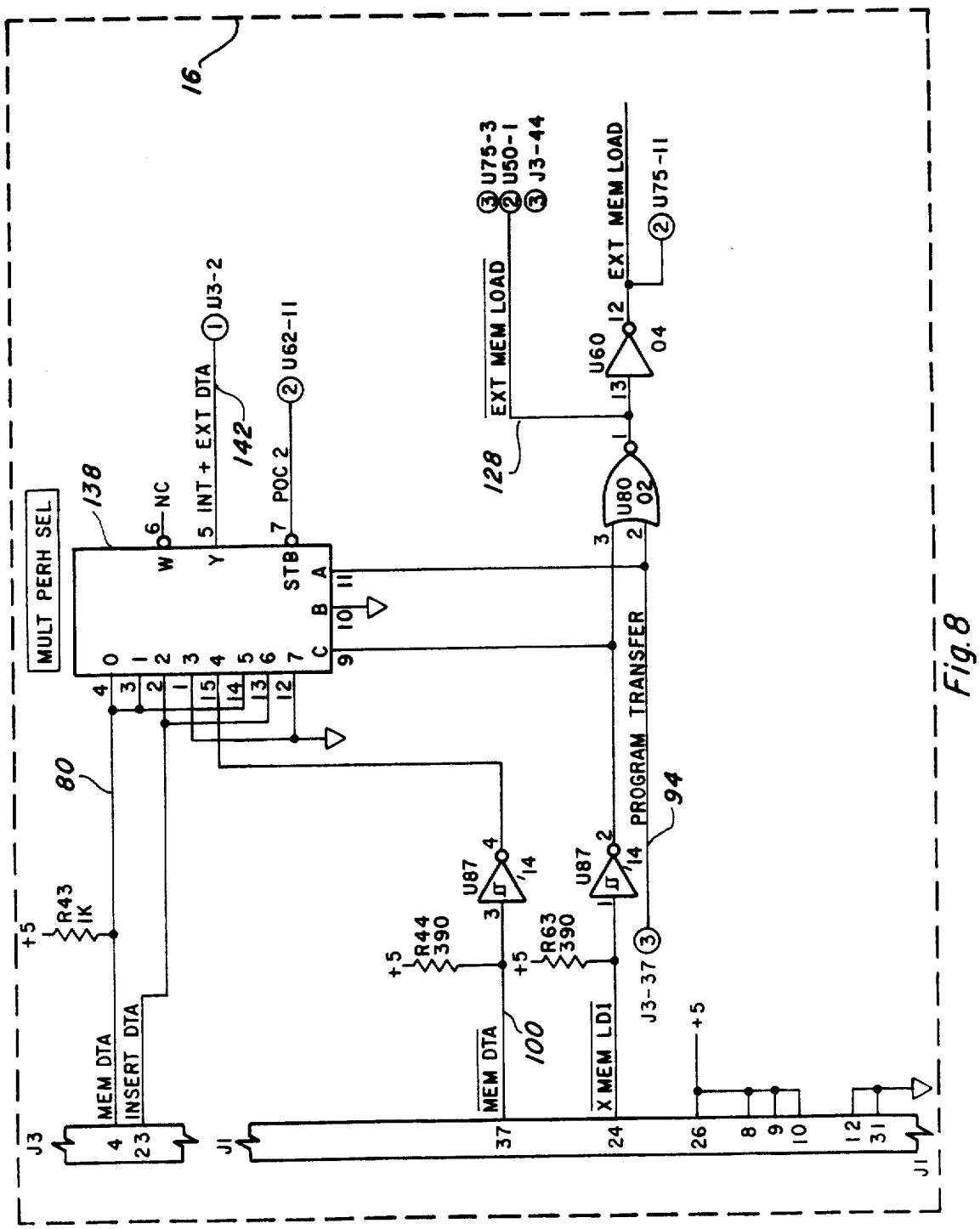
FIG. 8 is a schematic of part of the DATA TRANSFER Circuit.

The Data Transfer circuit 16 for digital system 10 is shown in three separate parts in FIGS. 5A, 6 and 8. Referring now to FIG. 5A, Data Transfer circuit 16 generates a PROGRAM TRANSFER signal which performs two functions: (1) it initiates the start of data transfer between memories 12 and 14, and (2) its pulse length defines the duration during which the transfer is in effect. This is an internally generated transfer signal. The PROGRAM TRANSFER signal is generated by a latch or bistable circuit 116. This circuit is set by a signal being applied to lead 118 and is reset when the CYCLE ENABLE signal is applied to lead 120. The PROGRAM TRANSFER signal may not be generated until the user sets certain switches. Key lock switch 122 must be set in the closed or program position and Program Transfer switch S6 must also be in the closed or transfer position. This will "enable" gate 124 and produce an enabling signal on line 126. When the signal $\overline{\text{EXT MEM LOAD}}$ is applied to lead 128, gate 130 is enabled, thereby setting the latch on circuit 116 and initiating the PROGRAM TRANSFER pulse. The $\overline{\text{EXT MEM LOAD}}$ signal is generated at the discretion of the user of the equipment by the depression of a key on a peripheral piece of equipment; this piece of equipment is shown in U.S. Pat. No. 4,030,080 in FIG. 1 and designated as keyboard input unit 600. The key that is depressed to initiate the signal is the WRT key of this peripheral.

Referring to FIG. 7, after Address Counter 90 has completed one full cycle, it generates an END SCAN signal on line 132 and is conditioned in gate 134 before going through latch 136. The END SCAN signal resets latch 136 and produces the CYCLE ENABLE signal on line 120 (in FIGS. 7 and 5A). Therefore, at the end of one complete scan of memory, the CYCLE ENABLE signal is generated and resets latch 116 which terminates the PROGRAM TRANSFER pulse.

Another portion of the Data Transfer circuit is illustrated in FIG. 8. Circuit 138 is a multiplexer which selects the source of data to be transferred. The sources are memory data (MEM DTA) which is transmitted along line 80 and data from an outside source $\overline{\text{MEM DATA IN 1}}$, such as a peripheral, transmitted along line 100. When the user depresses the WRT key on the peripheral 600 (peripheral terminal 600 described in the '080 patent), the $\overline{\text{X MEM LD 1}}$ signal is generated on line 140 which in combination with the PROGRAM TRANSFER pulse on line 94 causes multiplexer 138 to pass the information from one memory to the other via line 142.

FIG. 6 illustrates the third portion of Data Transfer circuit 16. For purposes of the data transfer function only, three key signals are applied to the input of circuit 144, namely a ROM/$\overline{\text{RAM}}$ signal applied to line 146, RITE FF signal applied to line 148 and the PROGRAM TRANSFER pulse applied to line 94. The outputs from circuit 144 appearing on leads 13 and 15 are $\overline{\text{RAM SELECT}}$ and $\overline{\text{ROM SELECT}}$, respectively. These output signals from leads 13 and 15 input to the Read/Write memory 12 and Non-volatile Memory 14, respectively (shown in FIG. 2). As mentioned previously, the RAM SELECT signal and ROM SELECT signal enable the respective memories during the read and write function. The ROM/$\overline{\text{RAM}}$ signal appearing on line 146 is normally set by the user through switch S8 (in FIG. 5A) which will dictate whether the system will operate from Memory 12 or Memory 14. The PROGRAM TRANSFER pulse appearing on line 94 (also see FIG. 5A) is generated when the contents of one memory are to be loaded into the other memory. The RITE FF signal generated on line 148 is a pulse which causes the memory (selected by the ROM/$\overline{\text{RAM}}$ signal) to write from one memory to the second memory.

Figure 10:
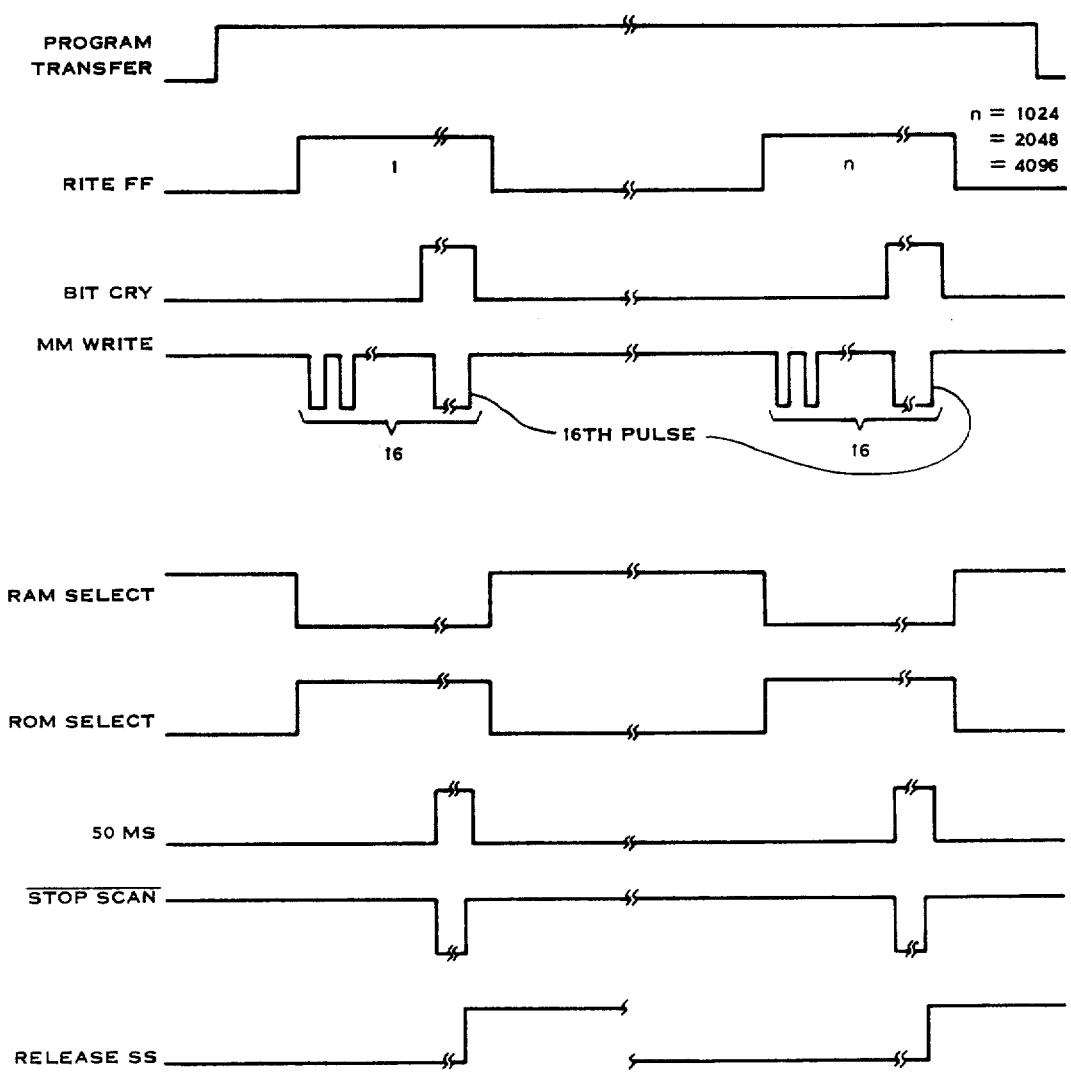
FIG. 10 are timing diagrams for a transfer of data into non-volatile memory.

The signal RITE FF on line 148 in conjunction with ROM/$\overline{\text{RAM}}$ on line 146 determine whether Read/Write Memory 12 or Non-volatile Memory 14 is selected on lines 13 and 15. When signal RITE FF on line 148 is "off" (a "read" from memory), either Read/Write Memory 12 or Non-volatile memory 14 is selected on lines 13 or 15, depending upon the state of ROM/$\overline{\text{RAM}}$ on line 146. In like manner, when the signal RITE FF on line 148 is "on" (a "write" into memory), either Read/Write Memory 12 or Non-volatile memory 14 is selected on lines 13 or 15, depending upon the state of the signal ROM/$\overline{\text{RAM}}$ on line 146. These waveforms are illustrated in FIG. 10.

In summary, the function of circuit 144 is to change the selected memory after a word is read but before it is written. Thus, if a transfer from Non-volatile memory 14 to Read/Write Memory 12 is desired, Data Transfer circuit 144 allows a word to be read from Non-volatile memory 14 (by selecting line 15), then it disables Memory 14 and selects Read/Write Memory 12 (via line 13).

SERIAL/PARALLEL DATA CONVERTER 48

FIG. 4A

The Serial/Parallel Data Converter 48 illustrates in FIG. 4A is comprised of two parallel-to-serial and serial-to-parallel data converters U17 and U19. These two converters are standard commercial items, model SN 74LS299, manufactured and sold by Texas Instruments Incorporated, Dallas, Tex. The output of Data Register 92 is connected to Serial/Parallel Data Converter 48 via line 81 and connected to pin 11 of converter U17. The output of U17 on pin 17 is connected by line 150 to pin 11 of converter U19. Converters U17 and U19 are connected in series configuration. Each converter has 8 bit capacity and by connecting them in series gives a total capacity of 16 bits. Data Buses 32A and 32B from Read/Write Memory 12 connect to the parallel inputs of converters U17 and U19, respectively. Additionally, Buses 32C and 32D, which connect to the Non-volatile Memory 14 are also connected to the parallel inputs of converters U17 and U19.

Accordingly, in operation, 16 bits of serial data may be read into Serial/Parallel Data Converter 48 along line 81 and then applied in parallel along Data Bus 32 to Memories 12 and 14. Conversely, data may be read from either Read/Write Memory 12 or Non-volatile Memory 14 in parallel into Serial/Parallel Data Converter 48 and then clocked out serially on output line 80.

DATA REGISTER 92

FIG. 7

Data Register 92 is comprised of four chips, U32, U35, U36 and U37, each of said chips including four flip-flops. These chips are SN 74LS163 chips manufactured and sold by Texas Instruments Incorporated, Dallas, Tex. These four chips are all connected in a series configuration. The output of U37 on pin 14 is connected by lead 152 to the input terminal, pin 6, of chip U36; this series connection is continued throughout, via leads 154 and 156. The output from Serial/Parallel Data Converter 48 is transmitted on lead 80 (FIG. 2) through conditioning logic (part of which is shown in Data Transfer circuit 16 in FIG. 8) and is thereafter inputted to pin 6 of chip U37 on line 158 in FIG. 7. The output from Data Register 92 appears on pin 14 of chip U32 and is transmitted via lead 81 to Serial/Parallel Data Converter 48 (FIG. 4A). Data Register 92 is a buffer register for storing serial data both from Read/Write Memory 12, Non-volatile Memory 14 and data provided by an external peripheral on line 100 (see FIG. 2).

ADDRESS COUNTER

FIG. 7

Address Counter 90 is comprised of three chips, U43, U45 and U46; these counters are SN 74LS163 as identified above. To connect the three chips U46, U45 and U43 as a binary counter, the carry output of U46 is connected by way of lead 160 to the carry input of U45; the output of U45 is connected via lead 162 to the carry input of U43. The twelve address outputs from Address Counter 90 form Address Bus 24 and are designated as K7–K16, K17' and K18'. The input signals SIZE A and SIZE B on lines 106 and 104, respectively, are connected to pins 5 and 6 of chip U43. These signals (SIZE A and SIZE B) are set by the position of switches S4 and S5 in Memory Size Select circuit 18 shown in FIG. 4B. The position of switches S4 and S5 uniquely define the size of Memories 12 and 14 and accordingly are required signals to Address Counter 90 in order to uniquely define the number of address locations in such memories. The END SCAN signal on line 132 indicates the termination of a complete scan of memory and has been described hereinabove with regard to Data Transfer circuit 16 in FIG. 5A.

U48 in Data Register 90 is similar in construction to the other counter chips and serves the function of clocking out the 16 bits of memory data when required.

MEMORY WRITE 50

FIG. 4B

Figure 9:
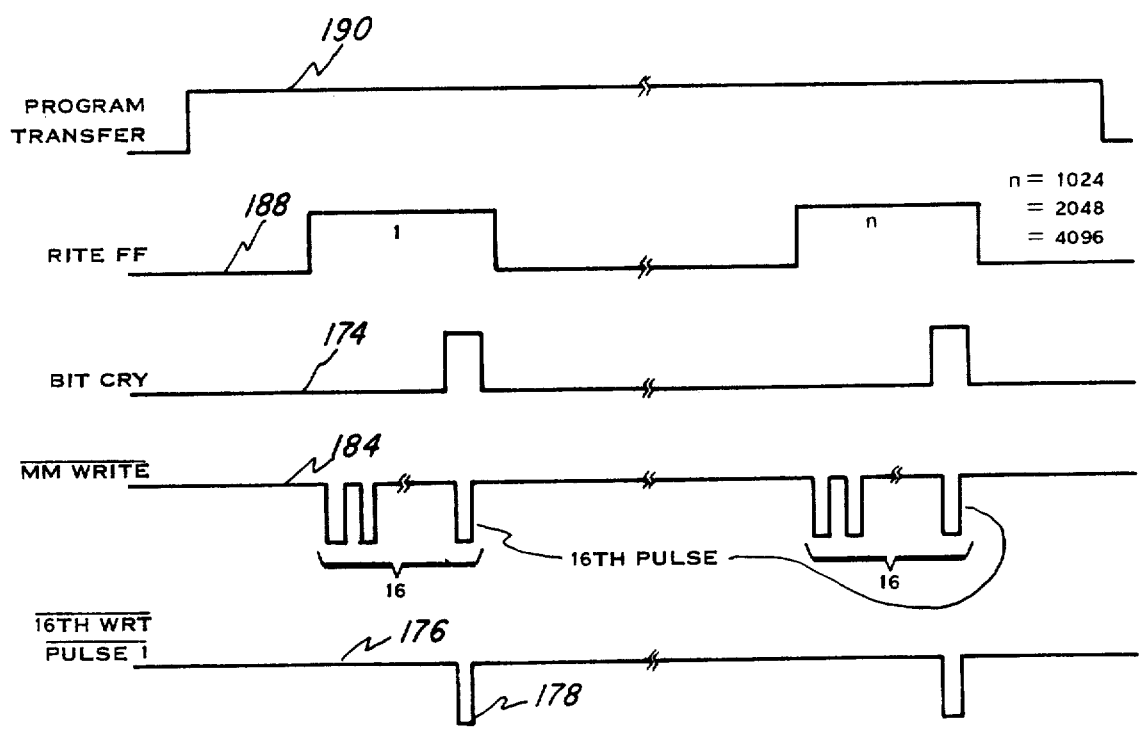
FIG. 9 are timing diagrams for a transfer of data into R/W memory.

The Memory Write circuit 50 is illustrated in FIG. 4B. The output of gate 170 produces the write pulse for Memory 12 designated as $\overline{\text{16th WRT PULSE 1}}$ on line 54. This write pulse on line 54 is connected to pin 10 of each of the memory chips U1–U16 in Read/Write Memory 12. As shown in FIG. 9, the $\overline{\text{16th WRT PULSE 1}}$ waveform 176 produces a pulse 178 which is the 16th bit generated by counter chip U48 in Address Counter 90 (FIG. 7). The pulse BIT CRY (waveform 174, FIG. 9) is applied as an input to gate 180 and the output 182 is applied to gate 170. The other input on line 172 to gate 170 is the signal $\overline{\text{MM WRITE}}$. $\overline{\text{MM WRITE}}$ is illustrated in FIG. 9 and is shown as waveform 184; it is comprised of 16 pulses. The $\overline{\text{MM WRITE}}$ signal is generated in logic circuitry described in U.S. Pat. No. 4,030,080 as the output from gate 24 in FIG. 5. By gating together the BIT CRY waveform 174 with the $\overline{\text{MM WRITE}}$ waveform 184 in gate 170 in the $\overline{\text{16th WRT PULSE 1}}$ pulse is generated on line 54 each time a RITE FF signal (see waveform 188 in FIG. 9) occurs. RITE FF signal 188 will occur "n" times, where n equals the amount of words in memory. For data to be transferred between Memories 12 and 14 during this time period, the PROGRAM TRANSFER pulse 190 must be "on" during this time period. The $\overline{\text{16th WRT PULSE 1}}$ signal on line 54 and the $\overline{\text{16th WRT PULSE 2}}$ on line 72 are identical. $\overline{\text{16th WRT PULSE 2}}$ on line 72 goes to Program Timing and Control circuit 38 (see FIG. 2) and is the enable signal allowing the Programming Timing and Control circuit 38 to generate the 50 millisecond Program Pulse on line 40 to Non-volatile Memory 14.

PROGRAM TIMING AND CONTROL 38, STOP/SCAN 56

FIGS. 4B and 5A

Referring now to FIG. 4B, in circuit 38, $\overline{\text{16th WRT PULSE 2}}$ is applied via line 72 to gate circuit 192. The output from gate circuit 192 is $\overline{\text{PGM HALT}}$ on line 58. This signal, $\overline{\text{PGM HALT}}$, is applied to Stop/scan circuit 56 in FIG. 4B as an input to gate 194 in the output of gate 194 and is a signal entitled $\overline{\text{STOP SCAN}}$ which is an input to General Timing and Control circuit 82 by way of line 64 in FIG. 7. The $\overline{\text{STOP SCAN}}$ signal in FIG. 7 is applied to counter enable pins 7 and 10 of the timing generator circuit U47, included in General Timing and Control circuit 82. This $\overline{\text{STOP SCAN}}$ pulse stops the clock function completely except for the clocking functions in Time Base circuit 74 and Peak Detector circuit 76.

The Program pulse on line 40 (FIG. 2) from Program Timing and Control circuit 38 is applied to Non-volatile Memory 14 when the leading edge of the 16th WRT PULSE 2 on line 72 (FIG. 4B) changes state. Circuit element 114 (FIG. 5A) generates a 50 millisecond signal which is combined in conditioning logic to produce the Program pulse on line 40 to Memory 14. Circuit element 114 generates the 50 millisecond pulse as a result of inputs to it from a counter located in Time Base circuit 74 which clocks on each peak of the AC line as a result of the output from Peak Detector 76. As mentioned earlier, STOP SCAN signal applied to line 64 to General Timing and Control circuit 82 stops the master clock for a time period equal to the duration of the Program pulse (50 milliseconds, i.e., the amount of time required to write 16 bits of data in parallel into Non-volatile Memory 14).

Time Base circuit 74 (FIG. 4B) produces a signal RELEASE SS on line 52 to Programming Timing and Control circuit 38 which results in restarting of the clock operation and termination of the Program pulse. Line 42 (FIGS. 5A and 2) is an "on/off" signal applied to Programmable Power Supply 34 which turns the power supply on to a voltage of +25 volts (the Program Voltage required by Non-volatile Memory 14). This signal, "OFF/ON", is generated when a Program Transfer switch S6 in Data Transfer circuit 16 (in FIG. 5A) is closed in conjunction with Keylock 122 being closed and switch S8 (FIG. 5A) is also closed indicating that the system is to write into PROM Memory 14.

PROGRAMMING POWER SUPPLY 34

FIG. 5A

The programming power supply 34 is illustrated in FIG. 5A and is a conventional switching regulator up-converter which converts +5 volts to +25 volts on line 36.

TIME BASE 74

FIG. 4B

Time Base circuit 74 in FIG. 4B includes counter 196 which generates three outputs $Q_A$, $Q_B$, $Q_C$, which count from 0-7 and are inputted to circuit element 114 in FIG. 5A. The most significant digit, $Q_D$, of counter 196, changes state at the count of 8 and generates RELEASE SS on line 52. This signal is in turn applied to Programming Timing and Control circuit 38 in FIG. 4B and is applied as an input to gate element 192. The output from gate element 192 changes the state of the PGM HALT on line 58 which in turn changes the state of the STOP SCAN in gate 194 located in Stop/scan circuit 56 (FIG. 4B). This in turn releases the system timing generator U47 in General Timing and Control circuit 82 (FIG. 7) and restarts system timing operation. Appropriate signals are applied to gate 198 in Time Base circuit 74 to ensure that the counter 196 is reset to zero at the beginning of a Program pulse count sequence.

VERIFY CIRCUIT 44

FIGS. 4B, 5B

The verify function is initiated by opening switch S7 shown in FIG. 5A. This ensures that the system is operating out of Non-volatile memory 14 due to the ROM/RAM signal going "high". During the verify function, all write pulses to memory are inhibited. This is accomplished in Verify circuit 44 in FIG. 4B by the application of the VERIFY SW signal to gate 200, the output of which is applied to line 202 to Memory Write circuitry 50 and forms an input to gate 180. This signal, VERIFY, applied to gate 180 inhibits write pulses and Program pulses. As in the normal operation of data transfer from Non-volatile Memory 14 to Read/Write Memory 12, the data from Memory 14 is transferred to Data Register 92 in FIG. 7 on line 158 in a serial manner. Similarly the data in Read/Write Memory 12 is transferred to Serial/Parallel Data Converter 48 via Data Bus 32. As data from Data Register 92 is transferred serially into Serial/Parallel Data Converter 48 for subsequent application to Read/Write Memory 12, it is compared with data in Serial/Parallel Data Converter 48 in gate 208 (FIG. 5B) which forms a comparator function in Verify circuit 44. As long as the signals on lines 46 and 204 are the same, flip-flop 206 will not change state. When there is a difference detected by comparator gate 208 between the signals on line 46 and 204, flip-flop 206 will change states such that its ouput 210 will drive transistor 212 "on", thereby turning LED diode 214 "on". The output of flip-flop 210 is fed back to gate 216 to latch flip-flop 206 into this new state. This is to allow LED diode 214 to be "on" long enough for the user to detect the error.

Verify circuit 44 in FIG. 5B also will check to see that the PROM memory 14 has been completely erased, for example, after exposure to ultraviolet light. This is accomplished in Verify circuit 44 in FIG. 5B by opening switch S9 which causes the signal on line 46 (which is equivalent to the Read/Write Memory data information) to go to a permanent "one" condition. When the PROM is erased by ultraviolet light, all bit locations should be "ones". Therefore, when switch S9 is open and a verify command is requested, the high voltage (all "ones") on line 46 is compared with the PROM erased data on line 204 (which should be all "ones") in comparator gate 208 and any differences are detected by flip-flop 206 and LED 214. A difference will indicate that one of the bit locations in PROM has not been erased from a "zero" to a "one".

Another capability of Verify circuit 44 is to locate the exact address position of any data which has been determined to be in error. Since the user may, by depressing the write (WRT) key in programmer 600 (FIG. 1 of U.S. Pat. No. 4,030,080), vary when the Program Transfer pulse starts within a scan of memory, the user may vary what address positions he wishes to scan. For example, if PROM memory is 4,096 words, the user may compare the memory contents from word 2,048 to word 4,096 by varying the initiation of the start of signal X MEM LD1 on line 140 in FIG. 8. If the Verify circuit 44 does not show an error in that scan (and more particularly LED 214 fails to turn "on"), then the user knows the error is located between word 1 and word 2,047. If when comparing the memory contents between word 1,024 and word 2,047, the LED diode 214 fails to turn "on", then the user knows the error is between word 1 and word 1,023. The user repeats this search routine until the exact word error location is determined.

As mentioned previously, the remaining logic functions of the system are described in U.S. Pat. No. 4,030,080 in connection with FIGS. 3-5 and FIG. 6. The system as described above allows for programming non-volatile memories without removing them from the system in which they are operating. The system also includes a number of additional features in that (1) it allows for memory to be expandable, (2) it has the flexibility to operate out of read/write memory or PROM memory, (3) it allows for "on-board" PROM programming, (4) it allows for program transfer between read/write and PROM memories, (5) it has the ability to check for an erased PROM before programming, and (6) it can compare read/write and PROM memories and locate single bit differences therebetween.

Although the present invention has been shown and illustrated in terms of a specific apparatus, it will be apparent that changes or modifications can be made without departing from the spirit and scope of the invention as defined by the appended claims.

I claim:

1. A digital system for on board programming of a non-volatile memory comprising:

(a) A read/write memory included within said system for storing data therein,
    (b) a non-volatile memory, said non-volatile memory comprised of means for programming said memory and means for writing data therein,
    (c) circuit means for transferring data into and out of each of said memories, said circuit means including means for generating enabling/disabling signals to said non-volatile memory and to said read/write memory during programming of said non-volatile memory,
    (d) timing means coupled to said non-volatile memory for generating a program pulse of predetermined duration to said non-volatile memory,
    (e) means for generating a program voltage signal of predetermined magnitude and applying said voltage signal to said non-volatile memory, said enabling/disabling signals, program pulse and program voltage signals being generated within said system and effecting transfer of data from said read/write memory to said non-volatile memory without removing said non-volatile memory from said system,
    (f) means for verifying proper programming of said non-volatile memory by the read/write memory comprising:

data circuit means coupled to said memories for transmitting the data outputs from each of said memories,
    electrically energizable visual means coupled to said data circuit means,
    comparator means coupled to said data circuit means for comparing the outputs for differences between the data in the non-volatile memory and the read/write memory and energizing said visual means upon detecting any of said differences, and
    latching means coupled to said visual means and adapted to latch the visual means in the energized state when energized as a result of detecting any of said differences,
    and means to vary when said program pulse signal starts within a scan of memory whereby different portions of the memory contents can be scanned to determine the exact location of any error,
    and means for changing the read/write memory storage input to said comparator to a constant voltage level and comparing said non-volatile memory output to said constant voltage level to determine whether said non-volatile memory has been completely erased.

2. A system according to claim 1 further including visual means for detecting such differences.

3. A system according to claim 1 wherein said non-volatile memory is a programmable read only memory.

4. A system according to claim 3 wherein said programmable read only memory is an ultraviolet programmable read only memory.

5. A system according to claim 1 wherein said system is a programmable controller.

6. A system according to claim 1 wherein said means for generating enabling/disabling signals generates enabling signals to the non-volatile memory and generates disabling signals to the read/write memory during programming of said non-volatile memory.

7. A system according to claim 1 wherein said data circuit means include a serial-to-parallel converter coupled to each of said memories.

8. A system according to claim 7 further including a data register coupled to said serial-to-parallel converter.

* * * * *